(12) United States Patent
Lee

(10) Patent No.: US 7,689,027 B2
(45) Date of Patent: Mar. 30, 2010

(54) RETICLE DISCERNING DEVICE, EXPOSURE EQUIPMENT COMPRISING THE SAME AND EXPOSURE METHOD

(75) Inventor: Myeong-Seok Lee, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 903 days.

(21) Appl. No.: 11/501,076

(22) Filed: Aug. 9, 2006

(65) Prior Publication Data

US 2007/0152167 A1    Jul. 5, 2007

(30) Foreign Application Priority Data

Jan. 3, 2006    (KR)    ............... 10-2006-0000650

(51) Int. Cl.
    *G06K 9/62*    (2006.01)
(52) U.S. Cl. .................................. 382/144
(58) Field of Classification Search ............ 382/144
    See application file for complete search history.

(56) References Cited

U.S. PATENT DOCUMENTS 6,330,053 B1 * 12/2001 Takayama ............... 355/77
6,819,968 B1 * 11/2004 Funk ....................... 700/121
6,826,451 B2    11/2004 del Puerto et al.
6,909,490 B2 *  6/2005 Hirayanagi ................ 355/30
2004/0017556 A1 *  1/2004 Nakahara .................. 355/70

FOREIGN PATENT DOCUMENTS

| JP | 2000-099619 | 4/2000 |
| JP | 2005-134347 | 5/2005 |
| KR | 1020010039251 A | 5/2001 |
| KR | 102005003287 A | 4/2005 |

\* cited by examiner

*Primary Examiner*—Brian P Werner
(74) *Attorney, Agent, or Firm*—Volentine & Whitt, PLLC

(57) ABSTRACT

A reticle discerning device includes a memory in which images of to-be-illuminated patterns of a plurality of reticles are stored as reference pattern images, respectively, a detection unit comprising an optical image sensor, and a processing unit connected to the memory and to the detection unit. The processing unit is operative to compare the reference pattern images with images detected by the optical image sensor of the detection unit. The reticle discerning device is used in exposure equipment having a stocker in which the reticles are stocked, an exposure apparatus, and a reticle transfer robot that transfers a selected one of the reticles from the stocker to the exposure apparatus. The detection unit captures an image of the pattern of the selected reticle and uses the image to discern the reticle and ensure that the correct reticle is transferred to the exposure apparatus. Specifically, the processing unit compares the captured image to one of the reference images stored in the memory of the reticle discerning device.

21 Claims, 7 Drawing Sheets

RETICLE DISCERNING DEVICE, EXPOSURE EQUIPMENT COMPRISING THE SAME AND EXPOSURE METHOD

BACKGROUND OF THE INVENTION

1. Field of the Invention

The present invention relates to photolithographic equipment and to a method of exposing a substrate performed by such equipment in the manufacturing of semiconductor devices and the like. More particularly, the present invention relates to a device capable of discerning whether the correct reticle is transferred to an exposure apparatus of photolithographic equipment, to exposure equipment having such a device and to a method of exposing a substrate using an exposure apparatus of photolithographic equipment.

2. Description of the Related Art

Today's highly integrated semiconductor devices have multi-layered structures of thin films, which form circuit patterns of the devices, and insulating layers alternately disposed one atop the other. Such devices are formed by repeatedly processing and polishing a silicon wafer. The various processes that are performed on the wafer include photolithography, etching process, thin film deposition, and diffusion processes. Among these processes, photolithography is used to form a pre-designed circuit pattern on the silicon wafer. In general, photolithography entails coating the wafer with a layer of photoresist, exposing the photoresist, and developing the exposed photoresist.

In the exposure process, light, such as UV light, emitted from a light source is directed onto the wafer, on which the photoresist layer has been formed, via a photomask or a reticle (each of which will be referred to hereinafter generically as a "reticle"). The reticle bears a pattern corresponding to the circuit pattern to be formed on the wafer. The reticle is illuminated by the light. Thus, an image of the pattern of the reticle is picked up and transferred to the layer of photoresist. The exposure process is performed by an exposure apparatus such as a scanner or a stepper.

The multi-layered structure of a typical semiconductor device currently in the market may have tens of layers of circuit patterns. Therefore, tens of reticles may be used to manufacture a single semiconductor device. Therefore, one of the most important operations in performing a state-of-the-art exposure process is to check whether the reticles are being used in the correct sequence, i.e., whether the correct reticle is loaded in the exposure apparatus for each individual exposure process. However, it is very difficult to visually discriminate the reticles based on their patterns alone because the reticles often have the same size and similar patterns.

Accordingly, each conventional reticle has a barcode, and the exposure apparatus includes a barcode reader for discerning the barcodes. The barcode reader recognizes the barcode of each reticle to be loaded into the exposure apparatus to discern whether the reticle is appropriate for the exposure process that is about to be performed. Regardless, an exposure of a photoresist layer using the incorrect reticle may still occur in the conventional exposure equipment having a barcode reader.

First, the barcode itself may have a defect of a type that causes the reticle to be misidentified. As a result, the exposure process may be delayed or incorrectly performed due to barcode recognition errors.

Secondly, the barcode of a conventional reticle is located in a region surrounding the pattern of the reticle, i.e., in a peripheral region of the reticle. In this case, the barcode may be partially erased or contaminated. Thus, the barcode reader may incorrectly recognize the barcode or recognize nothing at all, thereby causing a delay or error in the exposure process.

SUMMARY OF THE INVENTION

An object of the present invention is to provide a reticle discerning device capable of precisely discerning a reticle.

Likewise, an object of the present invention is to provide exposure equipment having a stock of reticles and an exposure apparatus to which selected one the reticles may be transferred in sequence, and which equipment can precisely discern the reticles so that the correct reticles can be transferred to the exposure apparatus.

Another object of the present invention is to provide an exposure method that ensures that a desired pattern is transferred at the right time to a substrate such as a semiconductor wafer.

Other objects of the present invention are to provide a reticle discerning device, exposure equipment and an exposure method capable of assuredly discriminating a plurality of stocked reticles from one another.

In accordance with a first aspect of the present invention, a reticle discerning apparatus includes a memory in which images of to-be-illuminated patterns of a plurality of reticles are stored as reference pattern images, respectively, a detection unit comprising an optical image sensor, and a processing unit connected to the memory and to the detection unit. The processing unit is operative to compare the reference pattern images with images detected by the optical image sensor of the detection unit.

According to another aspect of the present invention, exposure equipment includes a plurality of reticles, an exposure apparatus that can use each of the reticles to execute an exposure process in which an image of a pattern of a reticle is transferred to a substrate, a reticle transfer robot that transfers a selected one of the reticles to the exposure apparatus along a reticle transfer path, and the reticle discerning device. The detection unit of the reticle discerning device is disposed alongside the reticle transfer path. The optical image sensor is positioned to detect an image of the pattern of the reticle that is being transferred by the reticle transfer robot along the path. The processing unit is thus operative to compare the reference pattern images with images of the patterns of the reticles that are being transferred to the exposure apparatus.

The reticle discerning device may further include a pattern image detection light source unit including a light source for irradiating a region, namely, a region of the reticle pattern, the image of which is to be detected by the detection unit. In this case, the detection unit may be disposed side-by-side with the light source unit to gather light reflecting from the region irradiated by the light source. Also, the optical image sensor may comprise a CCD (charge coupled device).

According to still another aspect of the present invention, an exposure method includes transferring a reticle to an exposure apparatus, controlling the exposure apparatus to execute an exposure process, and discerning the reticle from an image of the "to-be-illuminated" pattern of the reticle before the exposure process is executed.

Several different reticles, i.e., reticles having different patterns, are stocked. An exposure recipe is formulated according to a sequence of products to be made or processes to be executed using the exposure apparatus. Then, one of the reticles from the stock of reticles is selected based on the exposure recipe. The selected reticle is transferred to the exposure apparatus, and is discerned prior to its use in the exposure apparatus.

In addition, images of the "to-be-illuminated" patterns of a plurality of reticles may be stored as reference pattern images, respectively. The selected reticle is discerned by detecting the image of a to-be-illuminated pattern of the reticle, and determining whether the detected image corresponds to one of the stored reference pattern images. Moreover, the image of the to-be-illuminated pattern is detected in a region of the reticle having a form equivalent to that of the reference pattern images. For example, the reference pattern images each have the form of an entire pattern of a respective reticle to be illuminated in an exposure process to be executed by the exposure apparatus. Alternatively, the reference pattern images each have the form of only a portion (one or more discrete parts) of a pattern of a respective reticle to be illuminated in an exposure process to be executed by the exposure apparatus.

BRIEF DESCRIPTION OF THE DRAWINGS

The foregoing and other objects, features and advantages of the invention will be more apparent from the following detailed description of the preferred embodiments of the invention, made with reference to the accompanying drawings. The drawings are not necessarily to scale, emphasis instead being placed upon illustrating the principles of the invention. Also, like reference numerals designate like elements throughout the drawings.

DETAILED DESCRIPTION OF THE PREFERRED EMBODIMENTS

Figure 1:
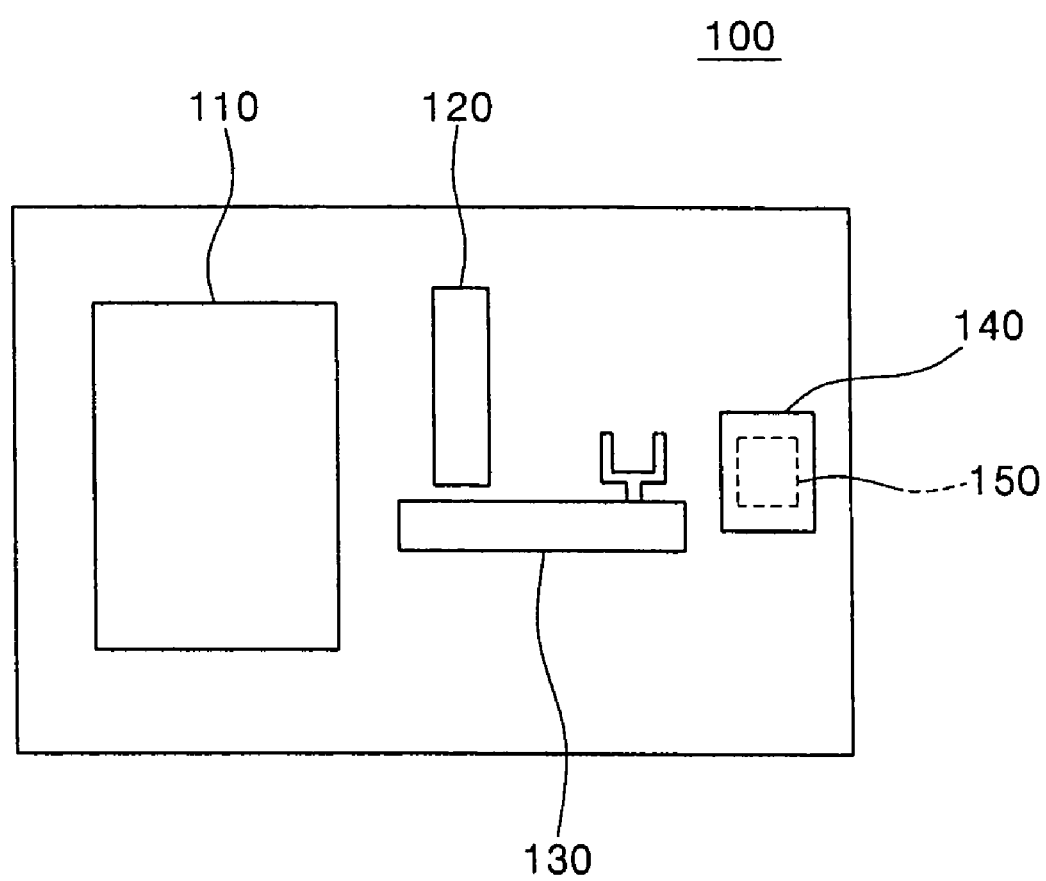
FIG. 1 is a schematic diagram of an embodiment of exposure equipment in accordance with the present invention.

Referring first to FIG. 1, exposure equipment 100 in accordance with the present invention includes an exposure apparatus 110 to be described in more detail later, a reticle stocker 140 for aligning reticles 150 and stocking the reticles 150 in a particular sequence, a reticle transfer robot 130 for sequentially transferring the reticles 150 from the reticle stocker 140 to the exposure apparatus 110, a reticle discerning device 120 for discerning whether the transferred reticle 150 is the correct reticle for the process that is about to be performed by the exposure apparatus 110, a wafer transfer robot (not shown) for loading a wafer to be exposed in the exposure apparatus 110 and for unloading the wafer from the exposure apparatus 110 after the wafer has been exposed, and a central control unit (not shown) for generally controlling the exposure equipment.

More specifically, the reticle stocker 140 has the shape of an upright box in which the reticles 150 are stacked as vertical spaced from one another. The reticle transfer robot 130 can reciprocate linearly between the reticle stocker 140 and the exposure apparatus 110 and is controlled by the central control unit. The reticle transfer robot 130 transfers a reticle 150 aligned and stocked in the reticle stocker 140 into the exposure apparatus 110 in response to a command issued by the central control unit when an exposure process is to be performed. Then, the reticle transfer robot 130 returns the reticle 150 to the reticle stocker 140 once the exposure process has been completed.

The reticle discerning device 120 is disposed along a reticle transfer path, i.e., the path along which the reticle transfer robot 130 transfers the reticles 150. The reticle discerning device 120 is operative to discern whether the reticle 150 being transferred to the exposure apparatus 110 is the correct reticle for the current process that is being performed by the exposure apparatus 110.

Figure 2:
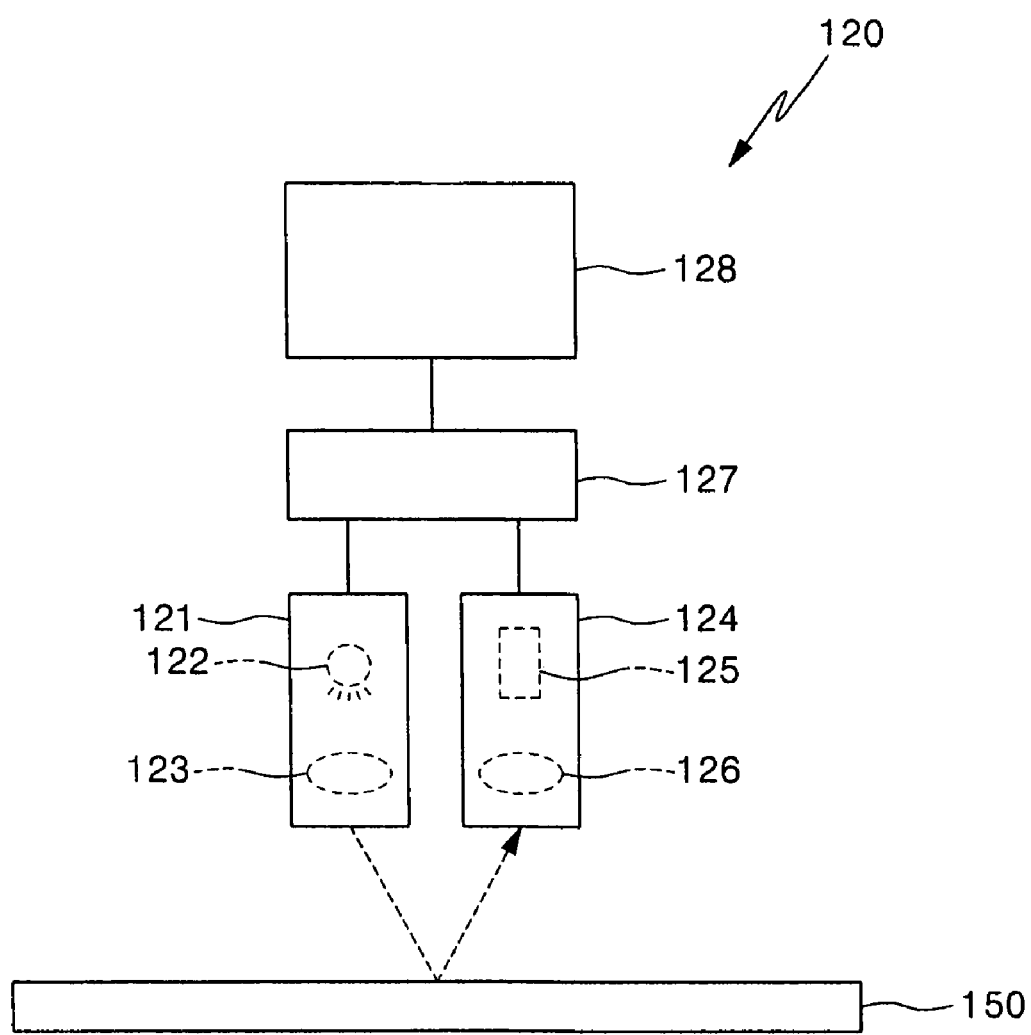
FIG. 2 is a schematic diagram of a reticle discerning device of the exposure equipment shown in FIG. 1.

As shown in FIG. 2, the reticle discerning device 120 includes a memory 128 for storing images of regions of "to-be-illuminated" patterns of a plurality of reticles 150 as reference pattern images, respectively, a detection unit 124 for detecting the image of a "to-be-illuminated" region of the pattern of a reticle 150, a processing unit 127 for determining whether the detected image corresponds to one of the reference pattern images, and a pattern image detection light source unit 121 for illuminating the reticle 150 that is to be transferred to the exposure apparatus. The pattern image detection light source unit 121 is operated in response to a control signal issued by the processing unit 127.

Figure 3A:
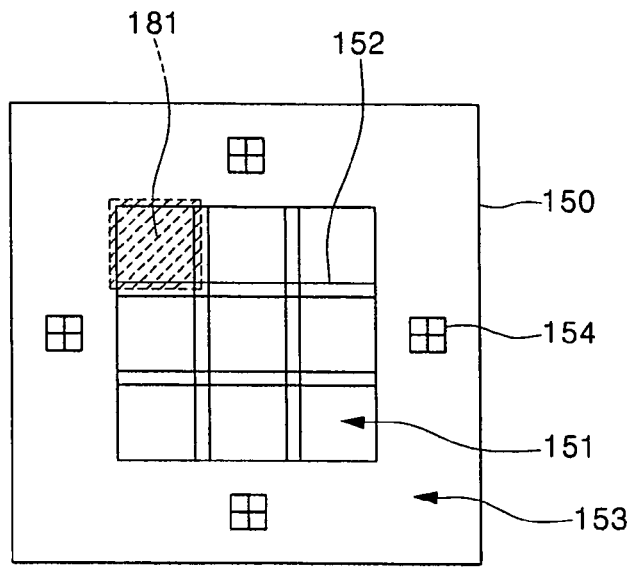
FIGS. 3A and 3B are each a plan view of a reticle examined by the reticle discerning device shown in FIG. 2, and illustrate different regions of the pattern that can be illuminated by the device and which may correspond to reference image patterns.
Figure 3B:
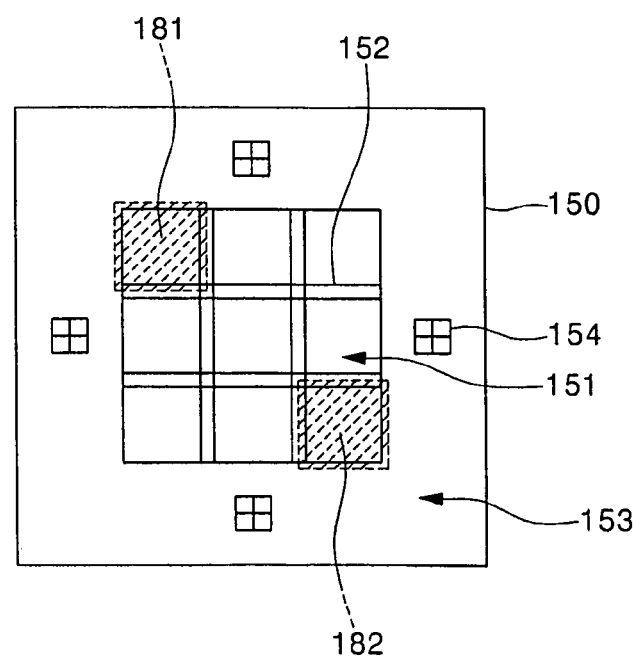

The memory 128 may comprise various types of data storage media such as ROMs or RAMs. In this respect, the images stored in the ROMs or RAMs of the memory 128 may be images of the patterns of the reticles 150 previously detected in sequence using the detection unit 124 of the reticle discerning device 120 or another detection unit (not shown) dedicated for this purpose. For instance, the images of the patterns of the reticles 150 stored in the memory unit 128 may be those previously detected in sequence during a time in which another product was made or other processes were carried out. Also, as shown in FIGS. 3A and 3B, the "to-be-illuminated" region of each reticle, whose image is to be stored and detected, may consist of only one region 181 of the pattern 152 of the reticle, several discrete regions 181 and 182 of the pattern 152 of the reticle, or the entire region of the pattern 152 of the reticle 150. Note, in FIGS. 3A and 3B, reference numeral 151 designates a central part of a reticle 150, reference numeral 153 designates a peripheral part of the reticle 150, and reference numeral 154 designates an alignment mark located in the peripheral part of the reticle 150 for use in aligning the reticle 150 with optics of the exposure apparatus 110 and hence, with a substrate that is to be exposed.

Referring back to FIG. 2, the light source unit 121 includes a light source 122 for generating light of a predetermined wavelength, and a lens 123 for focusing the light generated from the light source 122 onto the reticle 150. The detection unit 124 includes an optical sensor 125 for detecting light, and a lens 126 for focusing the light onto the sensor 125.

The reticle discerning device 120 is positioned so that the light generated by the light source unit 121 irradiates a region of the reticle 150 that is being transferred to the exposure apparatus 110, and so that any such light propagating from the reticle 150 is incident on the detection unit 124. For instance, the light source unit 121 and the light detection unit 124 may be disposed side-by-side so that light from the light source unit 121 is incident on the reticle 150 and reflects from the reticle 150 to the light detection unit. Alternatively, the light source unit 121 may be disposed under the reticle 150 opposite the detection unit 124. In this case, the detection unit 124 detects light generated by the light source unit 121 and transmitted through the reticle 150. In either case, the light is gathered by the lens 126 and is directed onto the sensor 125 so that the sensor 125 detects the light from the reticle 150. To this end, the lens 126 may be a condenser lens for condensing the light and the sensor 125 may comprise a CCD (charge coupled device) or a CMOS.

Furthermore, the regions of the reticles 150 that are irradiated and from which the light is detected by the detection unit 14 correspond to the form of the reference pattern images. For example, when the reference pattern images each have the form of only one part of the pattern of a reticle, only one region 181 of the pattern of the reticle 150 being transferred to the exposure apparatus is illuminated by the light source unit 121 as shown in FIG. 3A. Likewise, the image of a plurality of discrete regions 181 and 182 (FIG. 3B), or the entire region of the pattern of the reticle 150 may be detected by the detection unit 124 in correspondence with the form of the reference pattern image.

The processing unit 127 is connected to the memory 128 and the detection unit 124 to receive data representative of one of the reference pattern images stored in the memory 128 and the image of a region of the pattern of a reticle 150 as detected by the detection unit 124. The processing unit 127 receives the data from the memory 128 in a particular sequence according to a program or information input to the processing unit 127. The processing unit 127 is also configured to compare the reference pattern image received from the memory 128 with the image detected by the detection unit 124 and then based on the comparison to discern whether the reticle 150 is appropriate for the process that is about to be carried out by the exposure apparatus. That is, the processing unit 127 discerns that the selected and transferred reticle 150 is appropriate for use in the exposure apparatus 110 when one of the reference pattern images stored in the memory 128 corresponds to the image detected by the detection unit 124. In this case, the processing unit 127 signals the central control unit of the exposure equipment 100 to load the reticle into the exposure apparatus 110 and execute a process using the exposure apparatus 110. However, when the image detected by the detection unit 124 is different from the reference pattern image received by the processing unit 127 from the memory 128, the processing unit 127 discerns that the selected and transferred reticle 150 is inappropriate for use in the process about to be executed by the exposure apparatus 110. Accordingly, the processing unit 127 signals the central control unit to halt the transfer of the reticle to the exposure apparatus 110.

Figure 4:
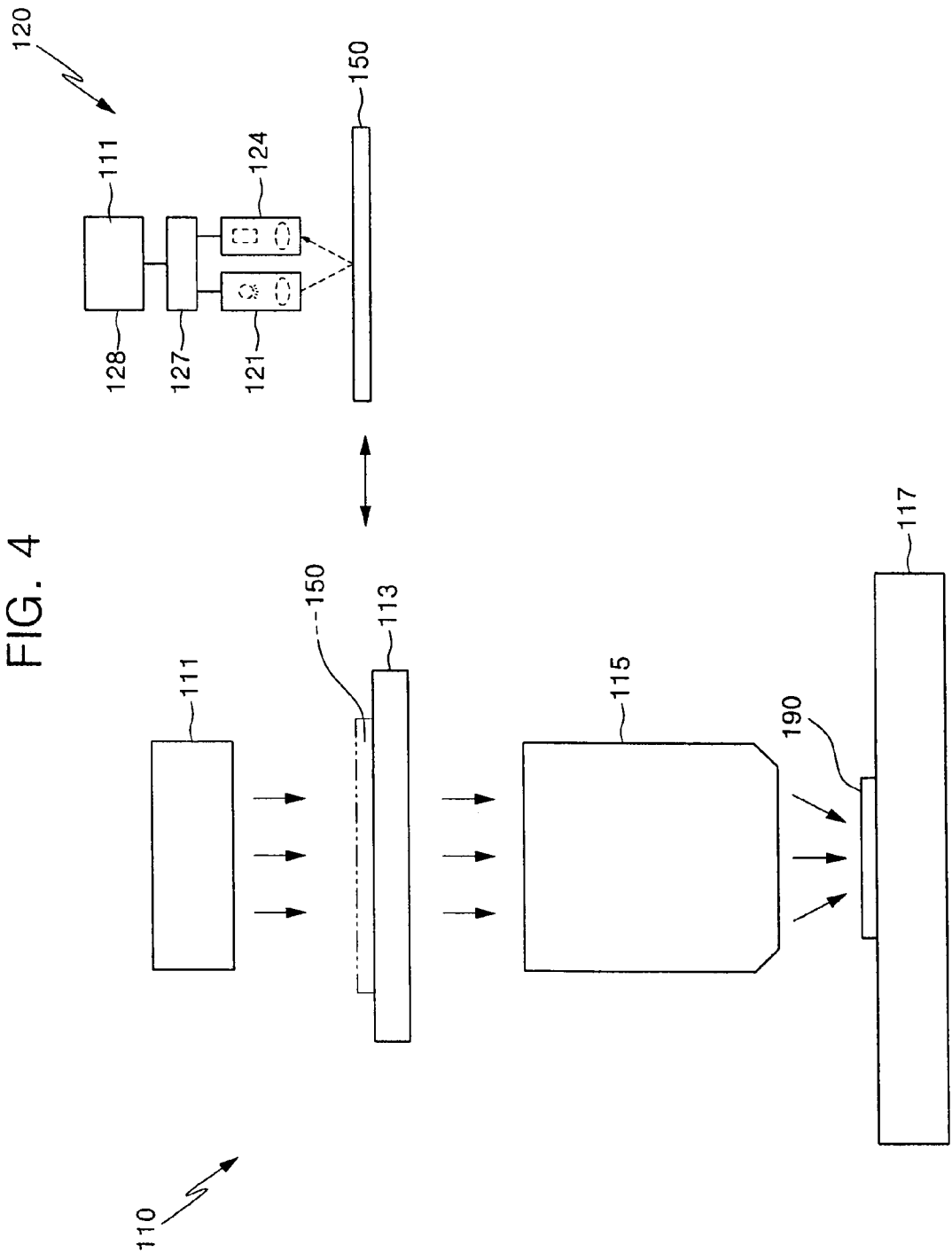
FIG. 4 is a schematic diagram of an exposure apparatus and a reticle discerning device of the exposure equipment shown in FIG. 1.

Referring now to FIG. 4, the exposure apparatus 110 includes a wafer stage 117 on which the wafer 190 is mounted, a reticle stage 113 on which the reticle 150 is mounted, a light source 111 for generating light of a predetermined wavelength such as UV light, and an optical system 115 for guiding the light generated from the light source 111 to the wafer 190. The reticle stage 113 may be disposed above the wafer stage 117, and the light source 111 may be disposed above the reticle stage 113. Therefore, the light generated from the light source 111 is directed onto the wafer 190 through the reticle 150 mounted on the reticle stage 113 so that an image of the pattern 152 of the reticle 150 is transferred to a layer of photoresist on the wafer 190, i.e., an exposure process is carried out. Also, in this respect, the wafer transfer robot (not shown) transfers the wafer 190 to be exposed to the wafer stage 117 of the exposure apparatus 110. Also, the wafer transfer robot unloads the wafer 190 from the wafer stage 117 after all of the desired regions of the layer of photoresist on the wafer 190 have been exposed. i.e., after one or more of the exposure processes referred to above have been performed. The central control unit (also not shown) controls the general operation of the exposure equipment 100. Specifically, the central control unit functions to control operations such as the transfer of the reticle 150 by the reticle transfer robot 130, the operation of the reticle discerning device 120, the exposure process performed by the exposure apparatus 110, the transfer of the wafer 190 by the wafer transfer robot, etc.

Figure 5:
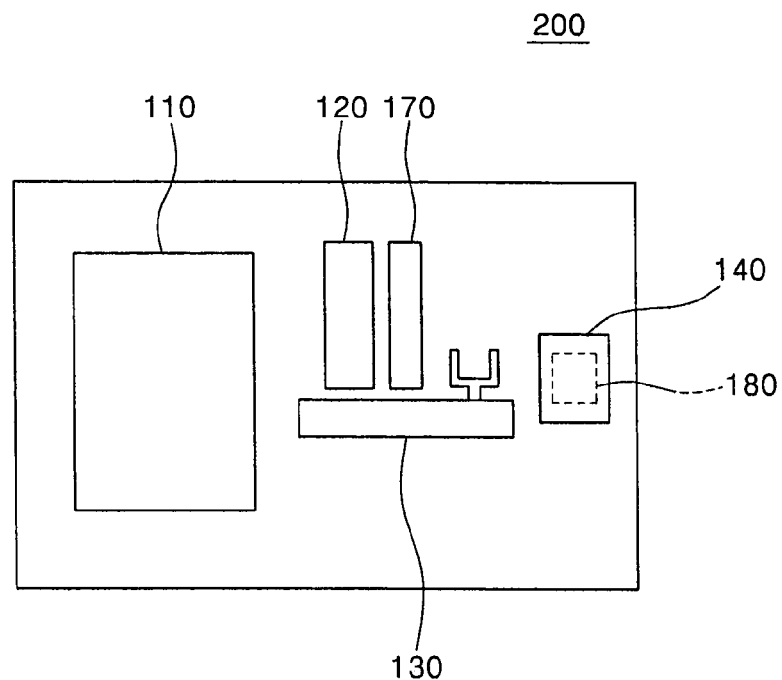
FIG. 5 is a schematic diagram of another embodiment of exposure equipment in accordance with the present invention.
Figure 6:
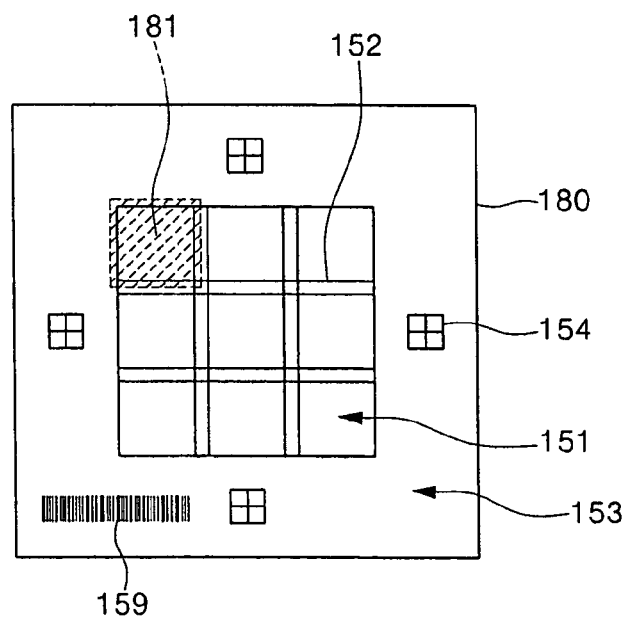
FIG. 6 is a plan view of a reticle used in the exposure equipment of the present invention.
Figure 7:
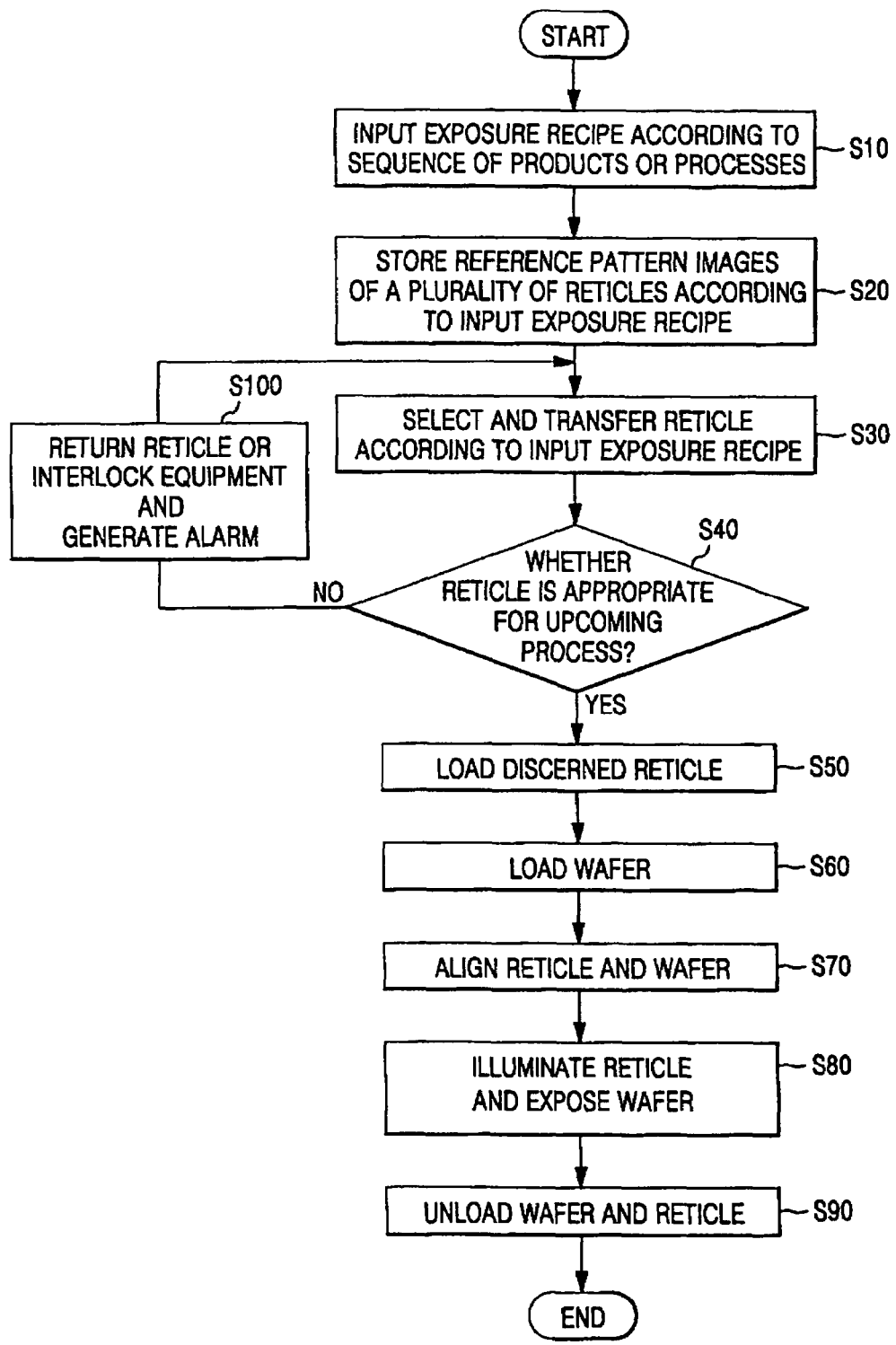
FIG. 7 is a flowchart of an exposure method in accordance with the present invention.

FIG. 5 shows another embodiment of exposure equipment in accordance with the present invention. Referring to FIGS. 5 and 6, the exposure equipment 200 includes a barcode reader 170 in addition to those components already described in connection with the embodiment of FIG. 1. Specifically, the barcode reader 170 reads a barcode 159 formed on a reticle 180 to discern whether the reticle 180 transferred by the reticle transfer robot 130 is a reticle 180 appropriate for use by the exposure apparatus 110 in performing the upcoming exposure process. Therefore, the reticle 180 transferred by the reticle transfer robot 130 is checked twice to discern whether it is appropriate: once by the barcode reader 180 and once by the reticle discerning device 120. Accordingly, the desired exposure process can be performed with a higher degree of certainty.

Hereinafter, an exposure process in accordance with the present invention will be described with reference to FIGS. 1 to 4, and 7.

First, a user inputs an exposure recipe to a central control unit of exposure equipment 100 (S10). The exposure recipe represents a sequence of products to be made or processes to be carried out.

Then, on the basis of the input exposure recipe, reference pattern images of a plurality of reticles used to manufacture a semiconductor device are stored in the memory 128 of the reticle discerning device 120 (S20). In this respect, images of the patterns of the reticles 150 previously detected in sequence using the detection unit 124 of the reticle discerning device 120 or another detection unit (not shown) dedicated for this purpose may be used as the reference pattern images. Also, as shown in FIGS. 3A and 3B, the form of each reference pattern image may correspond to only one region 181 of the pattern 152 of a reticle, several discrete regions 181 and 182 of the pattern 152 of a reticle, or the entire region of the pattern 152 of a reticle.

Then, the reticle transfer robot 130 selects one of the reticles from the reticle stocker 140 according to the input exposure recipe, and then transfers the selected reticle 150 towards the exposure apparatus 110 (S30).

Next, the reticle discerning device 120 discerns whether the reticle 150 being transferred is appropriate for the upcoming process to be executed by the exposure apparatus 110, and transmits the discerned result to the central control unit of the exposure equipment 100 (S40). When the reticle discerning device 120 determines that the reticle 150 being currently transferred is the correct reticle for the process, the central control unit directs the reticle transfer robot 130 to load the reticle 150 onto the reticle stage 113 of the exposure apparatus 110, and initiates an exposure process (S50). However, when the reticle discerning device 120 determines that the reticle 150 being currently transferred is not the correct reticle for the process, the central control unit directs the reticle transfer robot 130 to return the reticle 150 to the stocker 140 or interlock the equipment and generate an alarm (S100).

Meanwhile, the wafer transfer robot loads a wafer 190 to be exposed onto the wafer stage 117 once the correct reticle 150 has been loaded onto the reticle stage 113 by the reticle transfer robot 130 (S60).

Subsequently, the central control unit directs a driving mechanism of the wafer stage 117, for example, to align the reticle 150 and the wafer 190 using the alignment mark 154 of the reticle 150 (S70).

When the alignment is completed, the exposure apparatus 110 illuminates the reticle 150 to transfer an image of the pattern 152 of the reticle 150 onto the wafer 190, i.e., to expose a region of a layer of photoresist on the wafer 190 (S80).

The exposure process may be repeated for different regions of the wafer and/or using the same or different reticles depending on the exposure recipe. Once the last exposure process in a sequence has been performed, the central control unit directs the wafer transfer robot 130 and the wafer transfer robot to unload the reticle 150 from the reticle stage 113 and to unload the wafer 190 from the wafer stage 117, respectively (S90).

Figure 8:
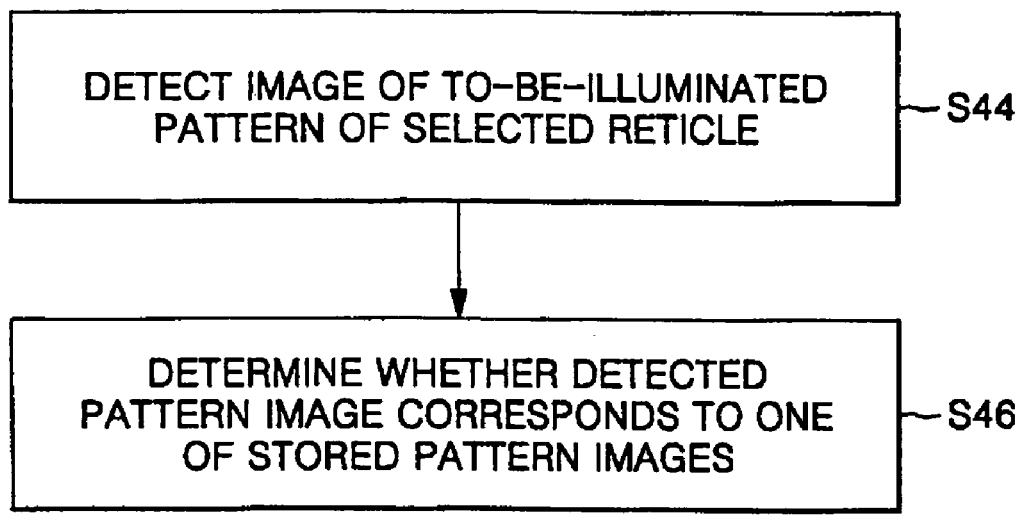
FIG. 8 is a flowchart of a reticle discerning subroutine of the exposure method shown in FIG. 7.

Next, the reticle discerning subroutine (S40) in accordance with the present invention will be described in more detail with reference to FIG. 8.

First, the detection unit 124 of the reticle discerning device 120 detects an image of the to-be-illuminated pattern of a reticle 150 that is selected from the reticle stocker 140 on the basis of the exposure recipe and is transferred towards the exposure apparatus. Also, the detection unit transmits the image to the processing unit 127 of the reticle discerning device 120 (S44). At this time, the image of the pattern of the reticle 150 detected by the detection unit 124 of the reticle discerning device 120 is taken in a region corresponding to the form of the reference pattern images. For example, when the reference pattern images each have the form of only part of the pattern of a reticle, the detection unit 124 of the reticle discerning device 120 detects an image of only a region 181 of the pattern of the reticle corresponding to that part (FIG. 3A or 6). Similarly, when the reference pattern images each have the form of discrete parts of the pattern of a reticle, the detection unit 124 of the reticle discerning device 120 detects an image of regions 181 and 182 of the pattern of the reticle corresponding to those parts (FIG. 3B). Alternatively, the reference pattern images may each have the form of the entire pattern of a reticle. In this case, the detection unit 124 of the reticle discerning device 120 detects an image of the entire central region of the reticle, i.e., the entire pattern of the reticle to be illuminated.

Then, the processing unit 127 compares one of the stored reference pattern images, i.e., a reference pattern image associated with the upcoming exposure process according to the input exposure recipe, with the detected image. Based on this comparison, the processing unit 127 determines whether the reticle 150 selected from the stocker 140 is the correct reticle for use in the upcoming exposure process (S46), and transmits a signal representative of this determination to the central control unit of the exposure equipment 100.

As can be seen from the foregoing, the present invention can precisely discern the reticles before the reticles are used in an exposure process, because the reticles are discerned using their "to-be-illuminated" patterns, namely the patterns whose images are to be transferred to the photoresist layer of a substrate. Therefore, incorrect reticles are prevented from being transferred to the exposure apparatus and/or used in the exposure process. Thus, the exposure process is carried out efficiently and without error.

Finally, although the present invention has been described in connection with the preferred embodiments thereof, the invention is not so limited. Rather, various modifications of the preferred embodiments are within the true spirit and the scope of the Invention as set forth in the appended claims.

What is claimed is:

1. A reticle discerning device comprising:
a memory in which images of to-be-illuminated patterns of a plurality of reticles are stored as reference pattern images, respectively;
a detection unit comprising an optical image sensor; and
a processing unit connected to said memory and to said detection unit and operative to compare the reference pattern images with images detected by the optical image sensor of said detection unit.

2. The reticle discerning device according to claim 1, further comprising a light source unit including a light source that generates light.

3. The reticle discerning device according to claim 2, wherein the light source unit and the detection unit are disposed side-by-side.

4. The reticle discerning device according to claim 3, wherein the sensor comprises a CCD (charge coupled device).

5. The reticle discerning device according to claim 1, wherein the reference pattern images are each images of an entire pattern of a respective reticle to be illuminated in an exposure process.

6. The reticle discerning device according to claim 1, wherein the reference pattern images are each images of only a portion of a pattern of a respective reticle to be illuminated in an exposure process.

7. Exposure equipment comprising:
a plurality of reticles each having a central region, and a peripheral region extending around the central region, and defining in the central region a pattern to be illuminated so that the image of the pattern is transferred to a substrate;
an exposure apparatus operative to illuminate the pattern of a selected one of the reticles and thereby transfer an image of the pattern to a substrate;
a reticle transfer robot that transfers a selected one of the reticles to the exposure apparatus along a reticle transfer path; and
a reticle discerning device, the reticle discerning device including a memory in which images of to-be-illuminated patterns of a plurality of reticles are stored as reference pattern images, respectively, a detection unit disposed alongside the reticle transfer path and comprising an optical image sensor that detects an image of the pattern of the reticle being transferred by the reticle transfer robot along the path, and a processing unit connected to said memory and to said detection unit and operative to compare the reference pattern images with images detected by the optical image sensor of said detection unit.

8. The exposure equipment according to claim 7, wherein the reticle discerning device further comprises a pattern image detection light source unit including a light source that generates light, the light source unit being disposed alongside the reticle transfer path so as to illuminate the reticle being transferred along the path by the reticle transfer robot.

9. The exposure equipment according to claim 8, wherein the detection unit and the light source unit of the reticle discerning device are disposed side-by-side such that light generated by the light source is reflected to the detection unit from the reticle being transferred along the reticle transfer path by the reticle transfer robot.

10. The exposure equipment according to claim 9, wherein the optical image sensor of the detection unit comprises a CCD (charge coupled device).

11. The exposure equipment according to claim 7, wherein the reference pattern images are each images of an entire pattern of a respective reticle to be illuminated in an exposure process.

12. The exposure equipment according to claim 11, wherein the reference pattern images are each images of only a portion of a pattern of a respective reticle to be illuminated in an exposure process.

13. The exposure equipment according to claim 7, wherein the exposure apparatus comprises a substrate stage dedicated to support a substrate to be exposed, a reticle stage to support a respective one of the reticles, a light source that generates light that illuminates the pattern of the reticle supported by the reticle stage, and an optical system that guides the light generated by the light source to a substrate supported by the substrate stage, whereby the light picks up an image of the pattern of the reticle supported by the reticle stage and transfers an image of the pattern to the substrate supported by the substrate stage.

14. The exposure equipment according to claim 7, wherein each of the reticles also has a barcode in the peripheral region thereof, and the reticle discerning device further comprises a barcode reader disposed along the reticle transfer path, whereby the barcode reader can read the barcode on a reticle transferred along the path by the reticle transfer robot.

15. An exposure method comprising:
transferring a reticle to an exposure apparatus;
controlling the exposure apparatus to execute an exposure process in which the reticle transferred to the apparatus is illuminated and an image of a pattern of the reticle is thereby transferred to a substrate; and
before the exposure apparatus is controlled to execute the exposure process, discerning the reticle from an image of the pattern of the reticle to be illuminated in the exposure apparatus.

16. The exposure method according to claim 15, further comprising:
stocking a plurality of the reticles having different patterns to be illuminated in an exposure process executed by the exposure apparatus;
formulating an exposure recipe according to a sequence of products to be made or processes to be executed using the exposure apparatus; and
selecting one of the reticles based on the exposure recipe from the stock of reticles, and
wherein the transferring of the reticle comprises transferring to the exposure apparatus the reticle selected from the stock of reticles, and the discerning of the reticle comprises discerning the reticle that is selected from the stock of reticles for transfer to the exposure apparatus.

17. The exposure method according to claim 15, further comprising:
stocking a plurality of the reticles having different patterns to be illuminated in an exposure process executed by the exposure apparatus; and
selecting one of the plurality of reticles for transfer to the exposure apparatus, and
wherein the discerning of the reticle comprises discerning the reticle selected for transfer to the exposure apparatus.

18. The exposure method according to claim 17, and further comprising:
storing images of to-be-illuminated patterns of a plurality of reticles as reference pattern images, respectively, and
wherein the discerning of the reticle comprises detecting the image of a to-be-illuminated pattern of the selected reticle, and
determining whether the detected image corresponds to one of the stored reference pattern images.

19. The exposure method according to claim 18, wherein the detecting of the image of a to-be-illuminated pattern of the selected reticle comprises detecting an image of the to-be-illuminated pattern in a region of the reticle having a form equivalent to that of the reference pattern images.

20. The exposure method according to claim 19, wherein the reference pattern images each have the form of an entire pattern of a respective reticle to be illuminated in an exposure process to be executed by the exposure apparatus.

21. The exposure method according to claim 19, wherein the reference pattern images each have the form of only a portion of a pattern of a respective reticle to be illuminated in an exposure process to be executed by the exposure apparatus.

* * * * *